(12) United States Patent
Campbell et al.

(10) Patent No.: US 7,990,709 B2
(45) Date of Patent: Aug. 2, 2011

(54) APPARATUS AND METHOD FOR FACILITATING COOLING OF AN ELECTRONICS RACK

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 12/565,189

(22) Filed: Sep. 23, 2009

(65) Prior Publication Data

US 2011/0069452 A1    Mar. 24, 2011

(51) Int. Cl.
*H05K 7/20* (2006.01)
*H05K 5/00* (2006.01)
*G06F 1/20* (2006.01)

(52) U.S. Cl. .............. 361/696; 361/679.47; 361/679.48; 361/679.53; 361/695; 361/698; 361/699; 361/701; 165/104.33; 454/184

(58) Field of Classification Search ............ 361/679.46, 361/679.48, 679.5, 679.53–679.54, 690, 361/694–696, 698–699, 701, 704; 165/77, 165/104.33, 185; 312/223.2, 236; 454/184; 52/69

See application file for complete search history.

(56) References Cited

U.S. PATENT DOCUMENTS

| | | | |
|---|---|---|---|
| 6,034,873 A * | 3/2000 | Ståhl et al. | 361/701 |
| 6,775,137 B2 | 8/2004 | Chu et al. | |
| 7,278,273 B1 * | 10/2007 | Whitted et al. | 62/259.2 |
| 7,385,810 B2 | 6/2008 | Chu et al. | |
| 7,430,118 B1 * | 9/2008 | Noteboom et al. | 361/695 |
| 7,477,514 B2 | 1/2009 | Campbell et al. | |
| 7,660,109 B2 * | 2/2010 | Iyengar et al. | 361/679.47 |
| 7,672,128 B2 * | 3/2010 | Noteboom et al. | 361/696 |
| 7,800,900 B1 * | 9/2010 | Noteboom et al. | 361/679.47 |
| 2009/0080173 A1 | 3/2009 | Schmidt et al. | |
| 2009/0086432 A1 | 4/2009 | Campbell et al. | |

(Continued)

OTHER PUBLICATIONS

Campbell et al., "Apparatus and Method for Providing In Situ Cooling of Computer Data Centers During Service Calls", U.S. Appl. No. 12/332,656, filed Dec. 11, 2008.

*Primary Examiner* — Robert J Hoffberg
(74) *Attorney, Agent, or Firm* — Dennis Jung, Esq.; Kevin P. Radigan, Esq.; Heslin Rothenberg Farley & Mesiti P.C.

(57) ABSTRACT

Apparatus and method are provided for facilitating cooling of air passing through an electronics rack. The apparatus includes a heat exchange assembly hingedly mounted above and external to the rack, such that air passing above the rack from an air outlet side to an air inlet side thereof passes through the heat exchange assembly, and is cooled. The heat exchange assembly includes a support structure to support hinged mounting of the assembly above the rack, and an air-to-liquid heat exchanger coupled to the support structure. The heat exchanger has an inlet plenum and an outlet plenum in fluid communication with respective connect couplings which facilitate connection of the plenums to coolant supply and return lines, respectively. The heat exchanger also includes heat exchange tube sections, each of which has a coolant channel with an inlet and an outlet coupled to the inlet and outlet plenums, respectively.

20 Claims, 15 Drawing Sheets

U.S. PATENT DOCUMENTS

| | | |
|---|---|---|
| 2009/0129000 A1 | 5/2009 | Hoeft et al. |
| 2009/0129015 A1 | 5/2009 | Nobile |
| 2009/0129016 A1 | 5/2009 | Hoeft et al. |
| 2009/0154096 A1* | 6/2009 | Iyengar et al. ............... 361/694 |
| 2009/0173017 A1* | 7/2009 | Hall ................................. 52/69 |
| 2010/0147490 A1* | 6/2010 | Campbell et al. ............ 165/80.3 |

* cited by examiner

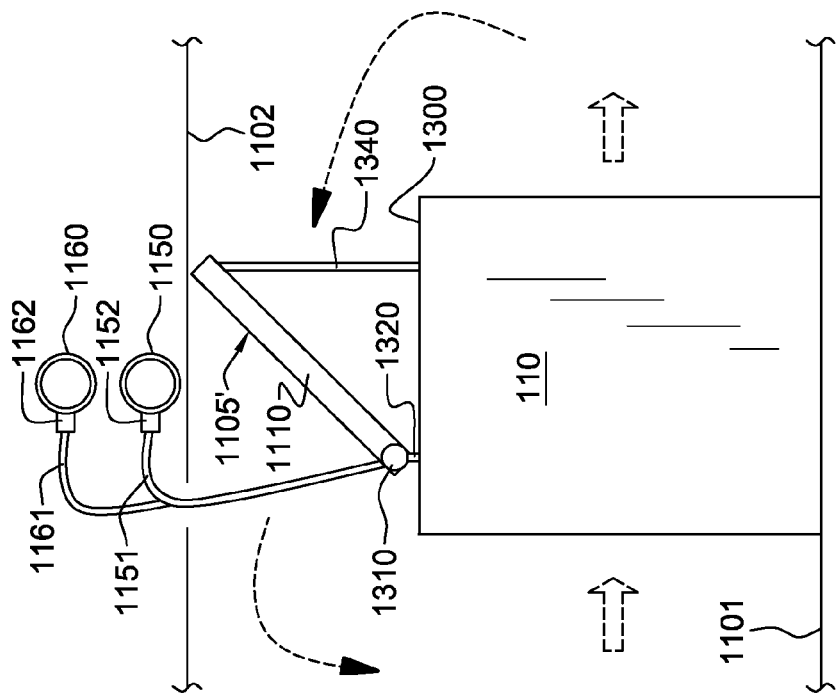
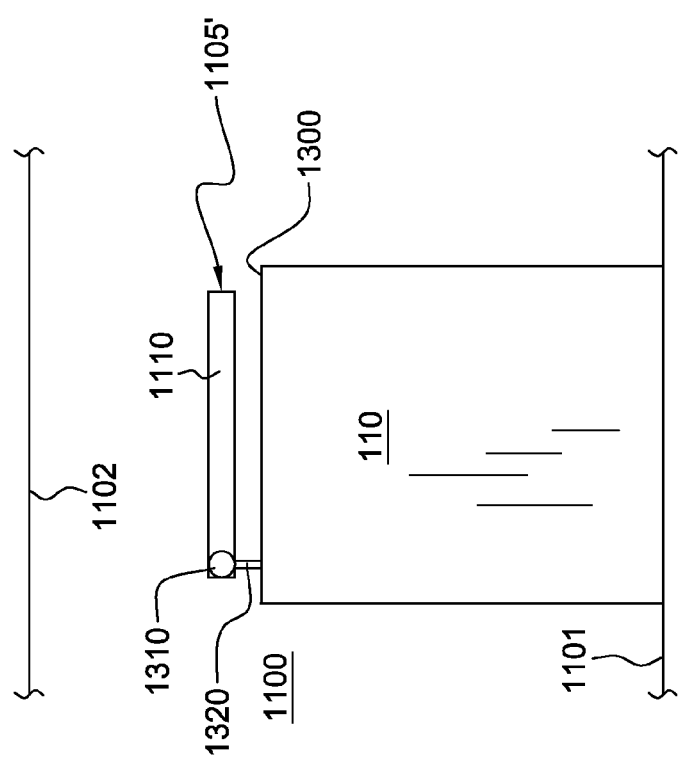

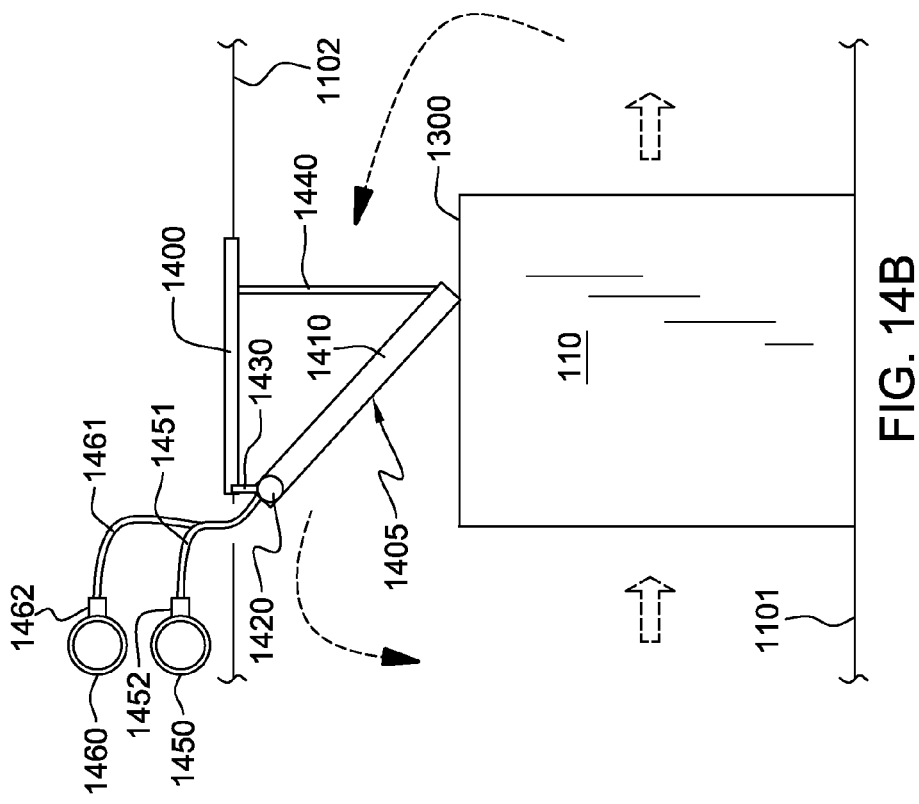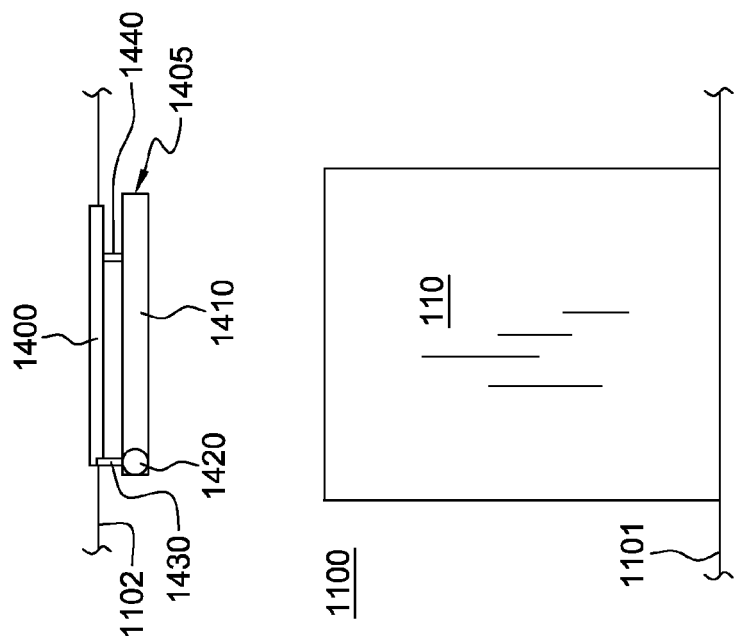

APPARATUS AND METHOD FOR FACILITATING COOLING OF AN ELECTRONICS RACK

BACKGROUND

The present invention relates in general to apparatuses and methods for facilitating cooling of rack-mounted assemblages of individual electronics units, such as rack-mounted computer server units.

The power dissipation of integrated circuit chips, and the modules containing the chips, continues to increase in order to achieve increases in processor performance. This trend poses a cooling challenge at both module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the availability of the room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or liquid cooled.

BRIEF SUMMARY

In one aspect, the shortcomings of the prior art and additional advantages are provided through the provision of an apparatus for facilitating cooling of an electronics rack. The apparatus includes an air-to-liquid heat exchange assembly for the electronics rack, wherein air moves through the electronics rack from an air inlet side to an air outlet side thereof, and when the air-to-liquid heat exchange assembly is disposed above and external to the electronics rack in an operative position, air passing above the electronics rack from the air outlet side to the air inlet side passes therethrough and is cooled thereby. The heat exchange assembly includes a support structure and an air-to-liquid heat exchanger. The support structure supports hinged mounting of the heat exchange assembly above and external to the electronics rack, and the air-to-liquid heat exchanger is coupled to the support structure. The air-to-liquid heat exchanger includes an inlet plenum and an outlet plenum in fluid communication with respective connect couplings of the heat exchange assembly, wherein the respective connect couplings facilitate connection of the inlet and outlet plenums to a coolant supply line and a coolant return line, respectively. The air-to-liquid heat exchanger further includes at least one heat exchange tube section, each heat exchange tube section including a coolant channel having an inlet and an outlet, each coolant channel inlet being coupled to the inlet plenum and each coolant channel outlet being coupled to the outlet plenum.

In another aspect, a cooled electronics system is provided which includes an electronics rack and a heat exchange assembly. The electronics rack includes: an air inlet side and an air outlet side which respectively enable ingress and egress of external air through the electronics rack; at least one electronics subsystem disposed within the electronics rack; and at least one air-moving device, the at least one air-moving device causing external air to flow through the electronics rack from the air inlet side of the electronics rack, across the at least one electronics subsystem to the air outlet side of the electronics rack. The heat exchange assembly is mounted above and external to the electronics rack, wherein when in an operative position, air passing above the electronics rack from the air outlet side to the air inlet side passes through the heat exchange assembly and is cooled thereby. The heat exchange assembly includes: a support structure to facilitate hinged mounting of the heat exchange assembly above and external to the electronics rack; and an air-to-liquid heat exchanger coupled to the support structure, the air-to-liquid heat exchanger having an inlet plenum and an outlet plenum in fluid communication with respective connect couplings of the heat exchange assembly, the respective connect couplings facilitating connection of the inlet and outlet plenums to a coolant supply line and a coolant return line, respectively, and wherein the air-to-liquid heat exchanger further includes at least one heat exchange tube section, each heat exchange tube section comprising a coolant channel having an inlet and an outlet, each coolant channel inlet being coupled to the inlet plenum and each coolant channel outlet being coupled to the outlet plenum.

In a further aspect, a method of facilitating cooling of an electronics rack is provided. The method includes: providing a heat exchange assembly configured to mount above and external to an electronics rack, wherein air moves through the electronics rack from an air inlet side to an air outlet side thereof, and wherein when the heat exchange assembly is mounted above the electronics rack in an operative position, air passing above the electronics rack from the air outlet side to the air inlet side passes through the heat exchange assembly and is cooled thereby; and wherein the heat exchange assembly includes a support structure to support hinged mounting of the heat exchange assembly above and external to the electronics rack, and an air-to-liquid heat exchanger coupled to the support structure, the air-to-liquid heat exchanger having an inlet plenum and an outlet plenum in fluid communication with respective connect couplings of the heat exchange assembly, the respective connect couplings facilitating connection of the inlet and outlet plenums to a coolant supply line and a coolant return line, respectively, and wherein the air-to-liquid heat exchanger further comprises at least one heat exchange tube section, each heat exchange tube section comprising a coolant channel having an inlet and an outlet, each coolant channel inlet being coupled to the inlet plenum and each coolant channel outlet being coupled to the outlet plenum.

Further, additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 13A & 13B depict an alternate embodiment of a cooled electronics system comprising an electronics rack and a heat exchange assembly, wherein the heat exchange assembly is shown in stored position in FIG. 13A and in operative position in FIG. 13B, in accordance with an aspect of the present invention; and FIGS. 14A & 14B illustrate another embodiment of a data center comprising a cooled electronics system which includes an electronics rack and a heat exchange assembly disposed above the electronics rack, wherein the heat exchange assembly is mounted to an overhead support structure of the data center, and is shown in stored position in FIG. 14A and in operative position in FIG. 14B, in accordance with an aspect of the present invention.

DETAILED DESCRIPTION

Figure 1:
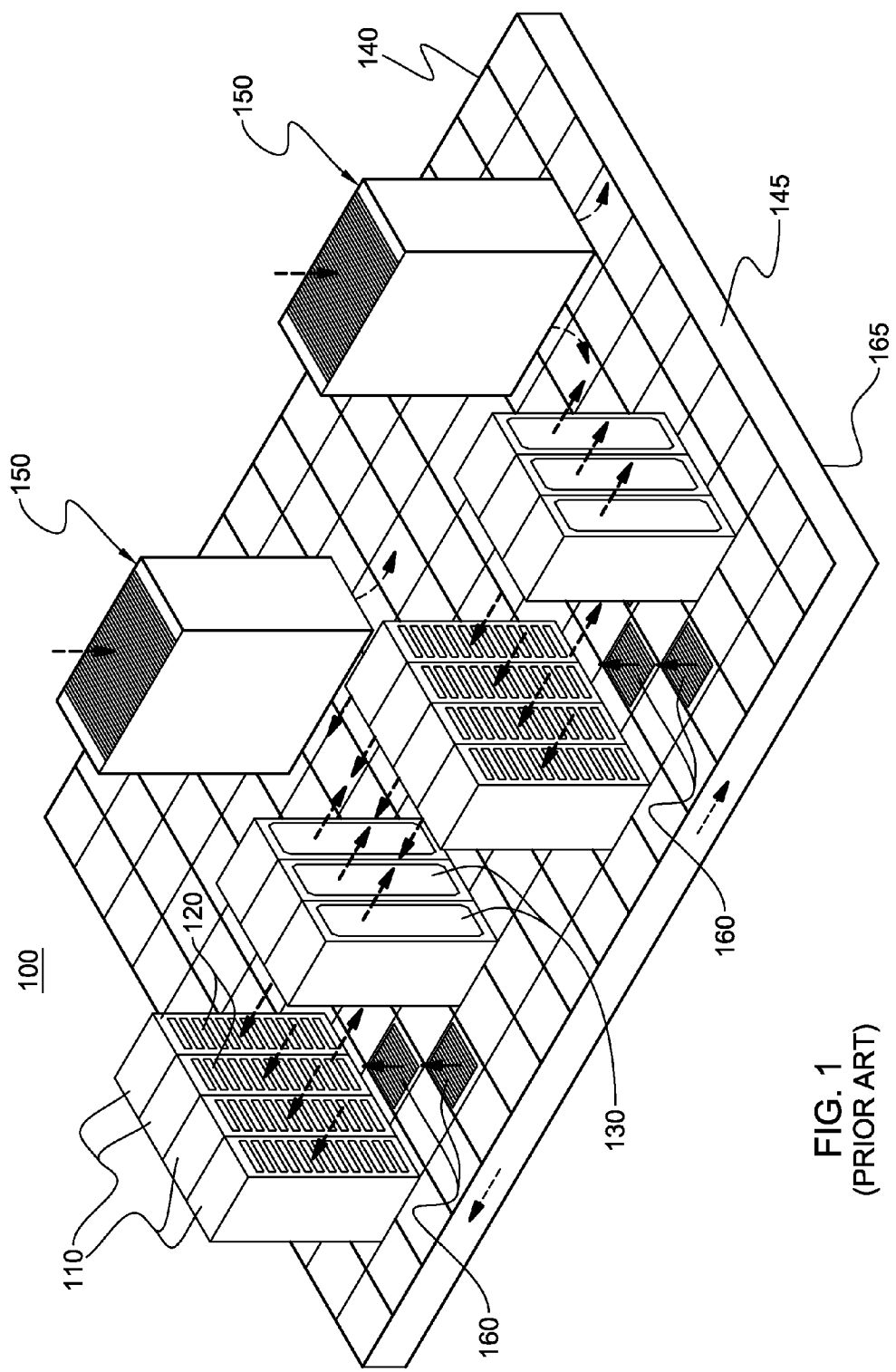
FIG. 1 depicts one embodiment of a conventional raised floor layout of an air-cooled data center.

As used herein, the terms "electronics rack", "rack-mounted electronic equipment", "rack unit" and "rack" are used interchangeably, and unless otherwise specified include any housing, frame, compartment, blade server system, etc., having one or more heat generating components of a computer system or electronics system, and may be, for example, a stand alone computer processor having high, mid or low end processing capability. In one embodiment, an electronics rack may comprise multiple electronics subsystems, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the rack-mounted electronics drawers of a multi-drawer rack unit and blades of a blade center system being two examples of subsystems of an electronics rack to be cooled.

"Electronic component" refers to any heat-generating electronic component of, for example, a computer system or other electronics unit requiring cooling. By way of example, an electronic component may comprise one or more integrated circuit dies and/or other electronic devices to be cooled, including one or more processor dies, memory dies and memory support dies. Further, unless otherwise specified herein, the term "liquid-cooled cold plate" refers to any conventional, thermally conductive structure having a plurality of channels or passageways formed therein for flowing of liquid coolant therethrough.

As used herein, "air-to-liquid heat exchange assembly" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-liquid heat exchange assembly and/or air-to-liquid heat exchanger thereof can vary without departing from the scope of the invention disclosed herein. A "liquid-to-liquid heat exchanger" may comprise, for example, two or more coolant flow paths, formed of thermally conductive tubings (such as copper or other tubing) in thermal communication with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a brine, a fluorocarbon liquid, a liquid metal, or other similar coolant, or refrigerant, while still maintaining the advantages and unique features of the present invention. As a specific example, the concepts described hereinbelow with reference to FIGS. 3-5 may employ water as facility coolant and a refrigerant as system coolant.

Reference is made below to the drawings (which are not drawn to scale to facilitate understanding of the invention), wherein the same reference numbers used throughout different figures designate the same or similar components.

As shown in FIG. 1, in a raised floor layout of an air cooled computer installation or data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have an air moving device (e.g., fan or blower) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" air aisle of the data center. The conditioned and cooled air is supplied to plenum 145 by one or more conditioned air units 150, also disposed within the computer installation 100. Room air is taken into each conditioned air unit 150 near an upper portion thereof. This room air comprises in part exhausted air from the "hot" air aisles of the data center defined by opposing air outlet sides 130 of the electronics racks 110.

Figure 2:
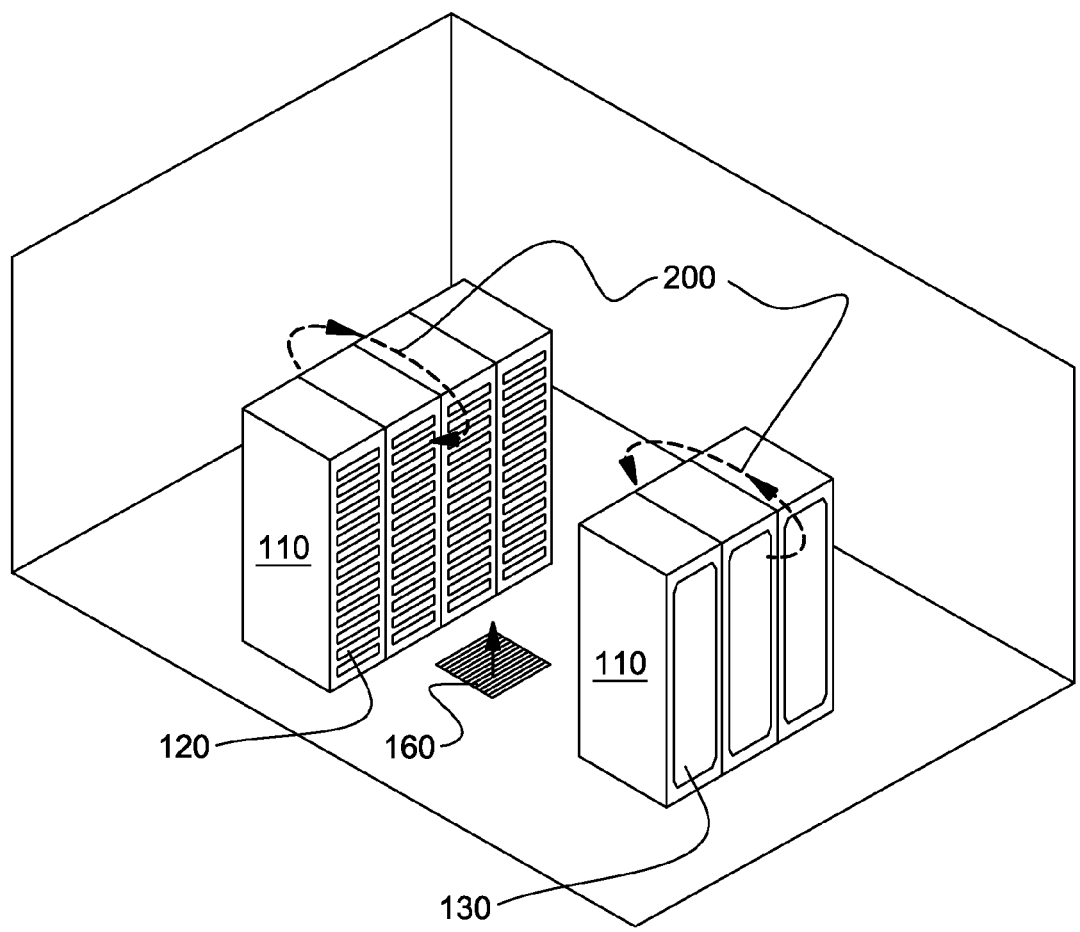
FIG. 2 depicts one problem addressed by the present invention, showing recirculation of airflow patterns in one implementation of a raised floor layout of an air-cooled data center.

Due to the ever increasing airflow requirements through electronics racks, and limits of air distribution within the typical computer room installation, recirculation problems within the room may occur. This is shown in FIG. 2 for a raised floor layout, wherein hot air recirculation 200 occurs from the air outlet sides 130 of the electronics racks back to the cold air aisle defined by the opposing air inlet sides 120 of the electronics rack. This recirculation can occur because the conditioned air supplied through tiles 160 is typically only a fraction of the airflow rate forced through the electronics racks by the air moving devices disposed therein. This can be due, for example, to limitations on the tile sizes (or diffuser flow rates). The remaining fraction of the supply of inlet side air is often made up by ambient room air through recirculation 200. This recirculating flow is often very complex in nature, and can lead to significantly higher rack unit inlet temperatures than might be expected.

The recirculation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 18-35° C. range. For a raised floor layout such as depicted in FIG. 1, however, temperatures can range from 15-20° C. at the lower portion of the rack, close to the cooled air input floor vents, to as much as 45-50° C. at the upper portion of the electronics rack, where the hot air can form a self-sustaining recirculation loop. Since the allowable rack heat load is limited by the rack inlet air temperature at the "hot" part, this temperature distribution correlates to an inefficient utilization of available air conditioning capability. Computer installation equipment almost always represents a high capital investment to the customer. Thus, it is of significant importance, from a product reliability and performance view point, and from a customer satisfaction and business perspective, to achieve a substantially uniform temperature across the air inlet side of the rack unit. The efficient cooling of such computer and electronic systems, and the amelioration of localized hot air inlet temperatures to one or more rack units due to recirculation of air currents, are addressed by the apparatuses and methods disclosed herein.

Figure 3:
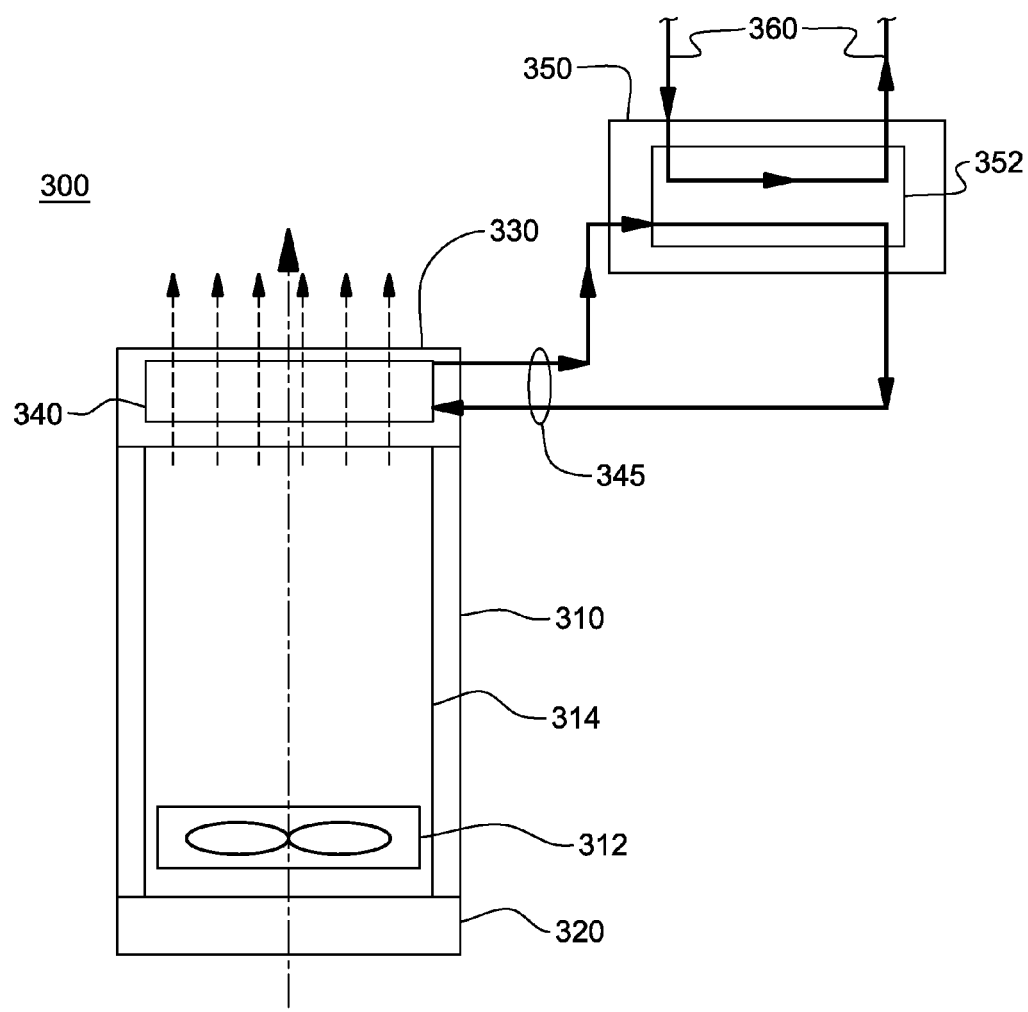
FIG. 3 is a top plan view of one embodiment of an electronics rack with an air-to-liquid heat exchanger mounted to an outlet door thereof (herein referred to as a rear door heat exchanger), in accordance with one aspect of the present invention.

FIG. 3 depicts one embodiment of a cooled electronics system, generally denoted 300, in accordance with an aspect of the present invention. In this embodiment, electronics system 300 includes an electronics rack 310 having an inlet door 320 and an outlet door 330, which respectively have openings to allow for the ingress and egress of external air, respectively, through the air inlet side and air outlet side of electronics rack 310. The system further includes at least one air-moving device 312 for moving external air across at least one electronics subsystem 314 positioned within the electronics rack. Disposed within outlet door 330 is an air-to-liquid heat exchanger 340 across which the inlet-to-outlet airflow through the electronics rack passes. A cooling unit 350 is used to buffer the air-to-liquid heat exchanger from facility coolant 360, for example, provided via a computer room water-conditioning unit (not shown). Air-to-liquid heat exchanger 340 removes heat from the exhausted inlet-to-outlet airflow through the electronics rack via the system coolant, for ultimate transfer in cooling unit 350 to facility coolant 360 via liquid-to-liquid heat exchanger 352 disposed therein. This cooling apparatus advantageously reduces heat load on existing air-conditioning units within the data center, and facilitates cooling of electronics racks by cooling the air egressing from the electronics rack and thus cooling any air recirculating to the air inlet side thereof.

As shown in FIG. 3, a system coolant loop 345 couples air-to-liquid heat exchanger 340 to cooling unit 350. In one embodiment, the system coolant employed is water. By way of example, such a system is described in U.S. Pat. No. 7,385,810 B2, issued Jun. 10, 2008, and entitled "Apparatus and Method for Facilitating Cooling of an Electronics Rack Employing a Heat Exchange Assembly Mounted to an Outlet Door Cover of the Electronics Rack".

Figure 4:
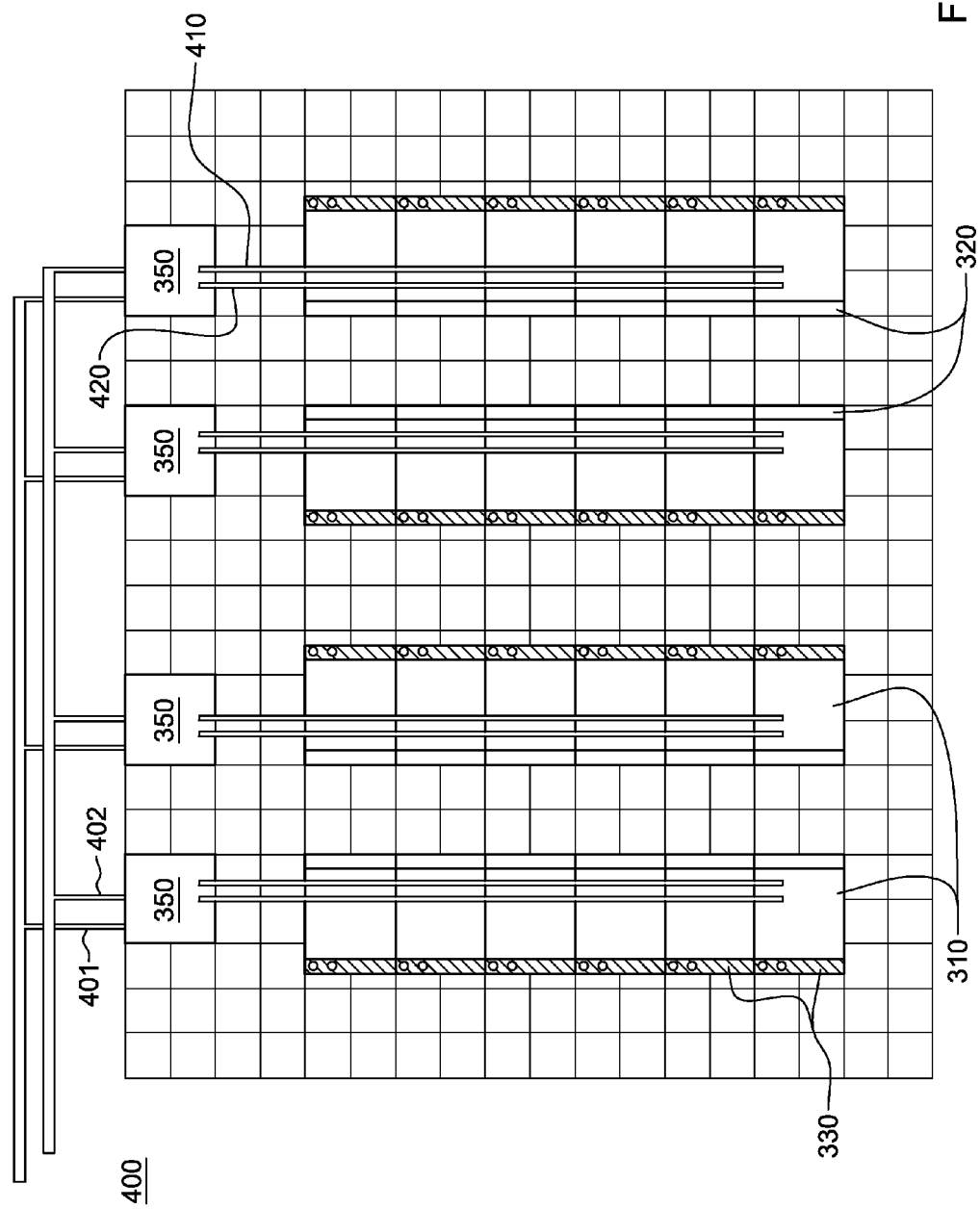
FIG. 4 is a top plan view of one embodiment of a data center employing cooling apparatuses comprising rear door heat exchangers, in accordance with an aspect of the present invention.

FIG. 4 is a plan view of one embodiment of a data center, generally denoted 400, employing cooled electronics systems, in accordance with an aspect of the present invention. Data center 400 includes a plurality of rows of electronics racks 310, each of which includes an inlet door 320 and a hinged outlet door 330, such as described above in connection with the embodiment of FIG. 3. Each outlet door 330 supports an air-to-liquid heat exchanger and system coolant inlet and outlet plenums as described further below. Multiple cooling units 350, referred to hereinbelow as pumping units, are disposed within the data center along with one or more air-conditioning units (not shown). In this embodiment, each pumping unit forms a system coolant distribution subsystem with one row of a plurality of electronics racks. Each pumping unit includes a liquid-to-liquid heat exchanger where heat is transferred from a system coolant loop to a facility coolant loop. Chilled facility coolant, such as water, is received via facility coolant supply line 401, and is returned via facility coolant return line 402. System coolant, such as water or refrigerant, is provided via a system coolant supply header 410 extending over the respective row of electronics racks, and is returned via a system coolant return header 420 also extending over the respective row of electronics racks. In one embodiment, the system coolant supply and return headers 410, 420 are hard-plumbed within the data center, and pre-configured to align over and include branch lines extending towards electronics racks of a respective row of electronics racks.

Figure 5:
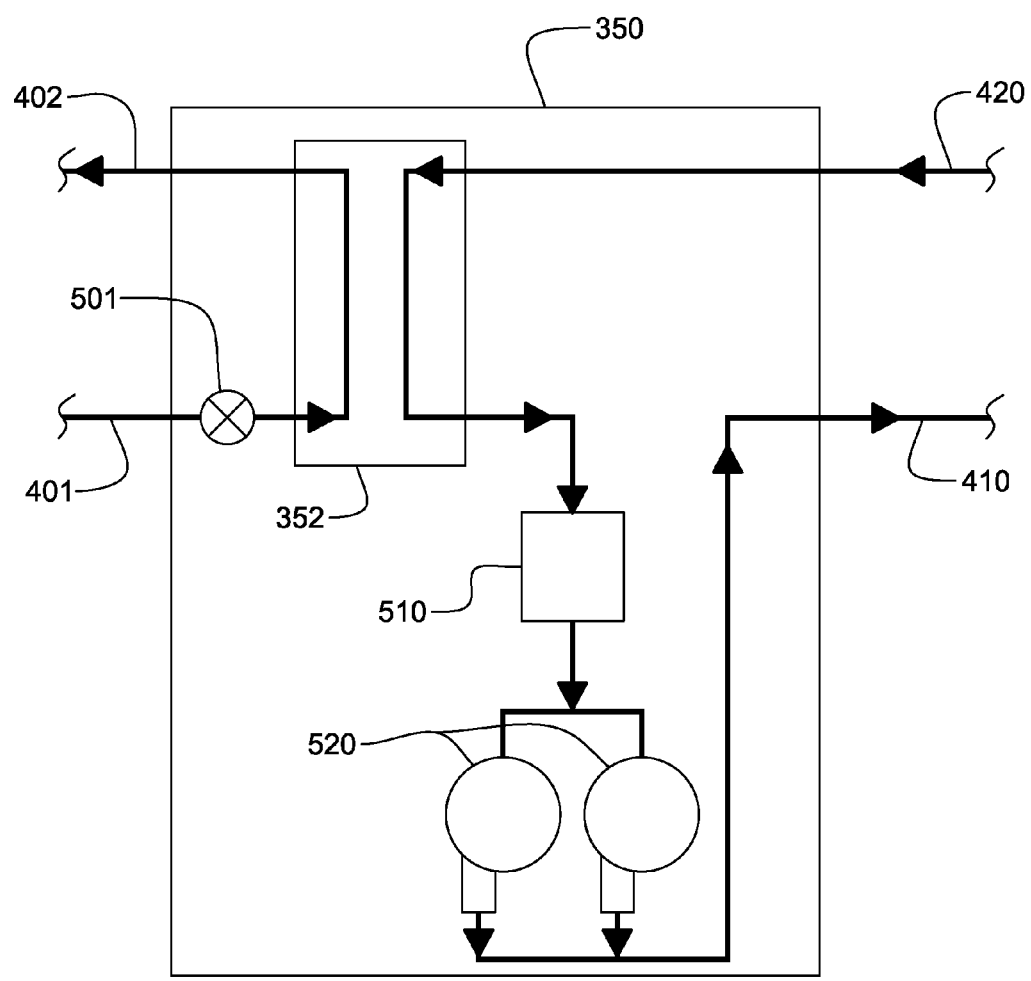
FIG. 5 is a schematic of one embodiment of a coolant distribution unit to be used in the data center of FIG. 4, in accordance with an aspect of the present invention.

FIG. 5 depicts one embodiment of a cooling unit 350 for the data center 400 of FIG. 4. Liquid-to-liquid heat exchanger 352 cools water passing through the system coolant loop comprising (in part) system coolant supply header 410 and system coolant return header 420. The facility coolant loop of liquid-to-liquid heat exchanger 352 comprises facility coolant supply line 401 and facility coolant return line 402, which in one embodiment, provide chilled facility water to the liquid-to-liquid heat exchanger. A control valve 501 may be employed in facility coolant supply line 401 to control facility coolant flow rate through the liquid-to-liquid heat exchanger 352. After passing through liquid-to-liquid heat exchanger 352, the cooled water is collected in reservoir 510 for pumping via a redundant pump assembly 520 back to the respective row of electronics racks via system coolant supply header 410.

Figure 6:
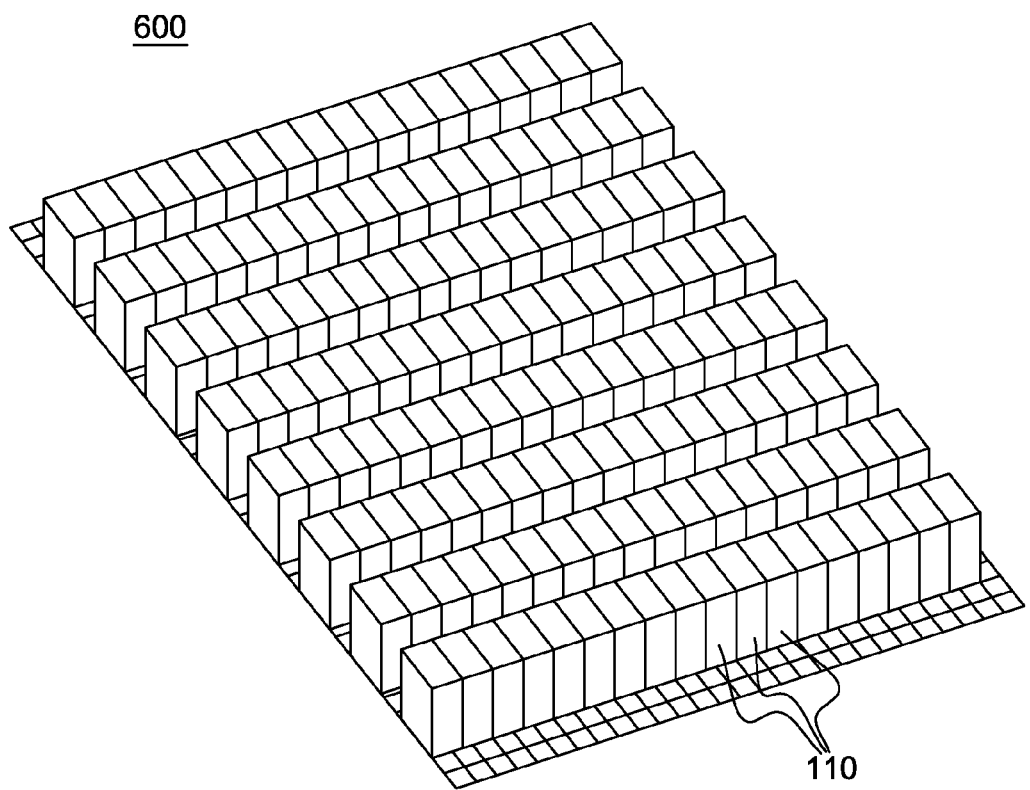
FIG. 6 depicts a further embodiment of a liquid-cooled data center layout, in accordance with an aspect of the present invention.

FIG. 6 provides a schematic illustration of a data center 600, discussed below in connection with certain different embodiments of the present invention. A plurality of racks 110, are housed in the data center as shown. The racks can resemble those depicted in FIG. 1, or those depicted in FIGS. 3 & 4, or be different in structure. As shown, all racks are disposed in close proximity in multiple rows of the data centers.

Data center facilities that house electronics racks or computer equipment represent a high capital investment and are typically designed to function for at least a number of years, often without any down time. The computer equipment is usually designed with the assumption of a rack air inlet temperature in the 24°-35° C. range. Although there are many different perspectives for optimizing such a computing facility, ensuring device reliability by delivering uninterruptible power and continuously cool air to the inlet of the electronics racks remains a significant goal. Thus, the cooling design of data center facilities is a continuing engineering challenge. In a standard data center room design (such as described above in connection with FIGS. 1 & 2), chilled air enters the room via perforated floor tiles, passes through the racks (getting heated in the process), then finds its way back to the intake of the air-conditioning units, known as Computer Room Air-Conditioning (CRAC) units, which cool the hot air and return the cooled air back into the under-floor plenum. If only a fraction of the airflow rate is supplied via the perforated floor tiles in front of the rack, then the remaining fraction of the supply side air is made up of ambient room air through mixing. This mixing and resulting recirculation can lead to complex flow patterns, and often results in significantly higher rack inlet air temperatures and possible violation of the rack's IT equipment specification inlet temperature.

In response to this problem, the rear door heat exchanger described above in connection with FIGS. 3-5 was developed. This concept makes it possible for customers to provide sufficiently cool air for server racks with increased power dissipation to efficiently address the hot air recirculation problem. As described above, the concept employs a water-cooled heat exchanger attached to the rear door of the computer rack. Temperature-conditioned water is supplied to the heat exchangers from one or more coolant distribution units (see FIGS. 3 & 5). The heated exhaust air passes through the water-cooled heat exchanger before exiting into the room. Under typical conditions for high power racks (+30 kW), such heat exchangers can remove 40%-60% of the heat that has been added to the air by the electronics. This results in significantly cooler air exiting the electronics racks, thereby substantially reducing the adverse effect of air recirculation. However, when the rear door of the rack is open to allow for the servicing of the rack, the rear door heat exchanger is no longer directly in the airflow path of the egressing hot air, and thus becomes a passive structure that does not perform the cooling function. As the use of the rear door heat exchanger becomes more and more pervasive, this lack of cooling function in maintenance mode is perceived as a problem.

CFD modeling of a data center (such as illustrated in FIG. 6) was performed to simulate normal operating mode with functional rear door heat exchangers, and maintenance mode where, for example, ten electronics racks in one of the middle rows of the data center have their rear doors open to allow for servicing. In the modeling, in normal operating mode, the maximum air temperature at the air inlet sides of the electronics racks was 25°-27° C., which is a reasonable condition for long term operation. However, in maintenance mode, with ten racks having inactive rear door heat exchangers a significant hot spot occurred, yielding unacceptably high rack air inlet temperatures, for example, as high as 60° C.

Thus, there is a significant need for a liquid-cooled electronics rack which provides an air-conditioning function during normal operating mode and during maintenance mode (i.e., when the rear door is open). The designs presented hereinbelow address this need.

Figure 7B:
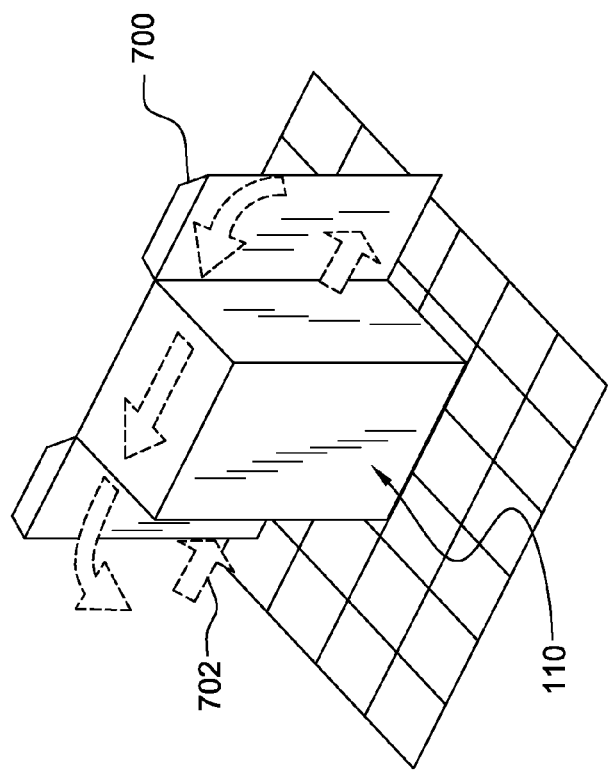
FIGS. 7A & 7B depict one embodiment of a liquid-cooled electronics rack, such as illustrated in FIG. 6, with an air-to-liquid heat exchanger mounted to an outlet door thereof, shown closed in FIG. 7A and open in FIG. 7B, in accordance with an aspect of the present invention.
Figure 7A:
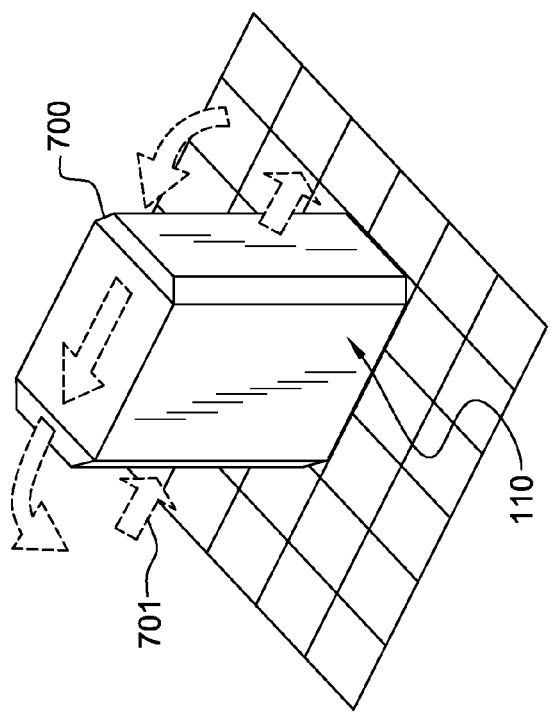

FIGS. 7A & 7B illustrate an electronics rack of, for example, data center 600 (in FIG. 6), which incorporates a rear door heat exchanger. FIG. 7A illustrates the rack during normal operating mode, while FIG. 7B illustrates the rack during a maintenance mode. The outlet door 700 is shown closed in FIG. 7A, while in FIG. 7B, the door is shown open. In addition, FIG. 7A provides an illustration of cool air recirculation, as indicated by arrows 701. In contrast, FIG. 7B indicates warm air recirculation, as indicated by arrows 702.

In the embodiment illustrated, the heat exchanger is disposed within the rear door 700 of the computer rack 110. In one embodiment, temperature conditioned water is supplied to the heat exchanger from a coolant distribution unit (such as described above in connection with FIG. 5). The heated air passes through the water-cooled heat exchanger before exhausting into the room. As noted, under typical conditions for high powered racks, the rear door heat exchangers can remove 40% to 60% of the heat that has been added to the air by the electronics, which results in much cooler air exiting the racks, thereby substantially reducing the adverse effect of air recirculation.

Figure 8B:
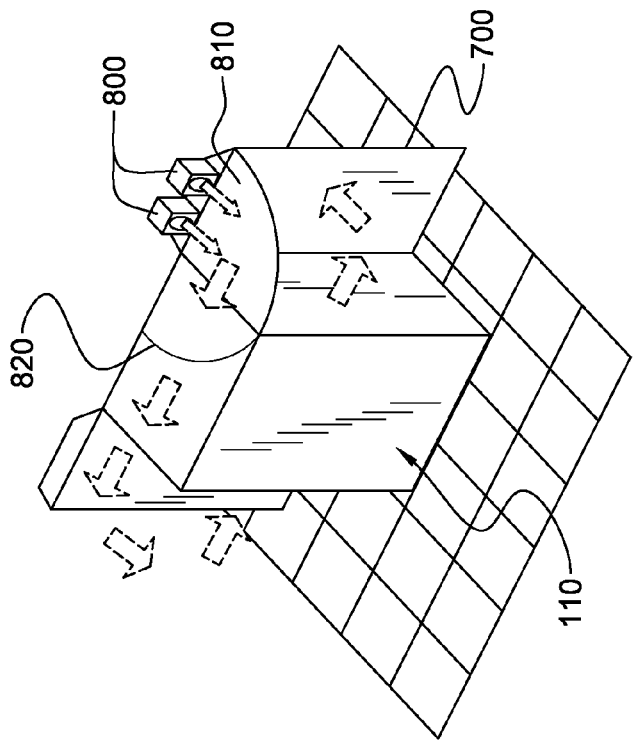
FIGS. 8A & 8B depict one embodiment of an air redirection mechanism mounted to the outlet door of the liquid-cooled electronics rack of FIGS. 7A & 7B, in accordance with an aspect of the present invention.
Figure 8A:
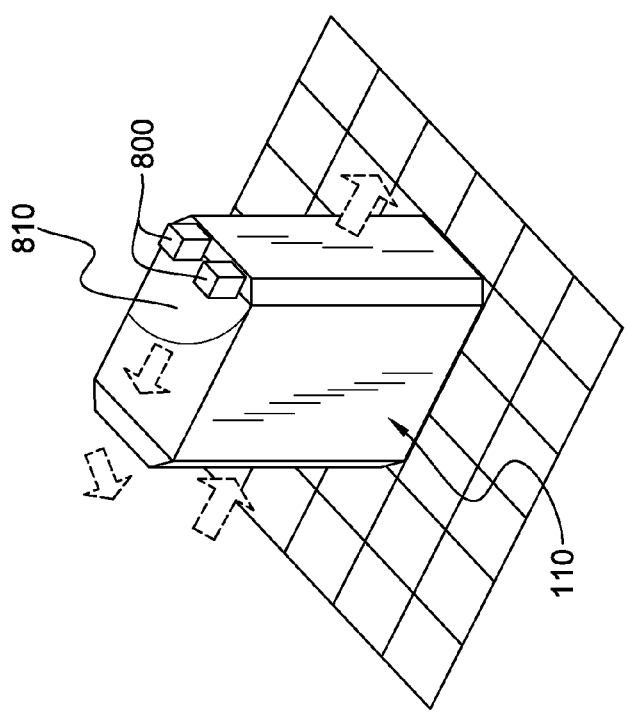

FIGS. 8A & 8B depict one embodiment of an enhancement pursuant to an aspect of the present invention, wherein cooling of the hot exhaust air is provided even during service mode, that is, when the rear door is open. As illustrated, an air redirection mechanism is provided comprising a plurality of air moving devices 800, a containment plate 810, internal ducting within the rear door, and an activator (not shown), such as an electrical switch, that turns the air moving devices (i.e. blowers) on when the door is opened.

FIG. 8A is a schematic of electronics rack 110 in normal operating mode. In this mode, air-moving devices 800 are turned off (i.e., in the "OFF mode"), and hot air exhausting the servers flows through the rear door heat exchanger, and is cooled before exiting the back face of the rear door 700. In the illustrated embodiment, a plurality of air moving devices 800 are used, two of which are shown. It is possible, however, to increase or decrease the number of air-moving devices as required.

In the embodiment of FIG. 8A, air-moving devices 800 are disposed and attached to the top of the rear door 700 and to containment plate 810, which is shown in a closed position. Containment plate 810, in one embodiment, has a quarter circle shape and is made of sheet metal, but in alternate embodiments other shapes and sizes can be utilized. In addition, containment plate 810 is attached along one of its edges to the rear door 700, as shown.

As the door is opened (see FIG. 8B), air-moving devices 800 are activated. This may be accomplished by turning a switch (not illustrated), such as an electrical switch. In the case of the embodiment of FIG. 8B, activation of the switch leads to the air-moving devices being turned ON. In this manner, hot air exhausting from the rack servers is drawn into the rear door heat exchanger, where it is cooled, and then expelled over the top of containment plate 810 to find its way back to the inlet of the rack, as illustrated by the arrows in FIG. 8B. Note that containment plate 810 is illustrated in opened position in FIG. 8B. Containment plate 810 facilitates shepherding of hot air into the heat exchanger, while also isolating the hot and cold airstreams. As air is expelled from air-moving devices 800, containment plate 810 facilitates directing the cooled air back across the top surface of the electronics rack from the air outlet side to the air inlet side (as illustrated by the arrows in FIG. 8B).

In an alternate embodiment, the air-moving devices used can be angled selectively so as to optimally direct the air in a direction that is more aligned with the rack inlet.

In the embodiment depicted in FIGS. 8A & 8B, containment plate 810 is secured to a curved, almost C-shaped rail 820 that is attached to the top surface of the rack. Rail 820 is used to guide the movement of the containment plate 810. In the closed position, it ensures that this containment plate 810 is held in place and as the door is opened, the rail serves to guide containment plate 810 as it shifts to its new position. This curved rail can be selectively altered in shape to adjust to the design of a variety of containment plates. In one embodiment, rail 820 is made of sheet metal and attached to the rear door via bolts or via welding, although many other alternative designs are possible.

Figure 9C:
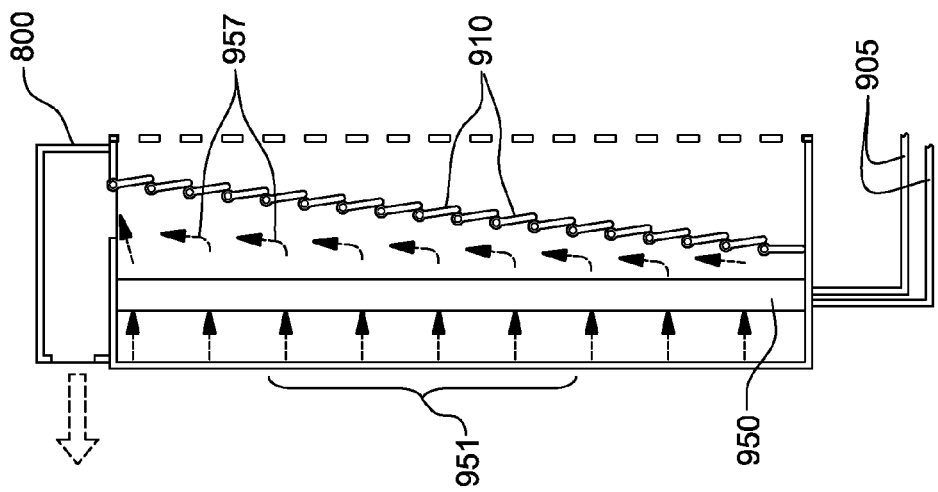
FIGS. 9A-9C provide different schematic sectional views of the operation of the outlet door and air redirection mechanism depicted in FIGS. 8A & 8B, in accordance with an aspect of the present invention.
Figure 9B:
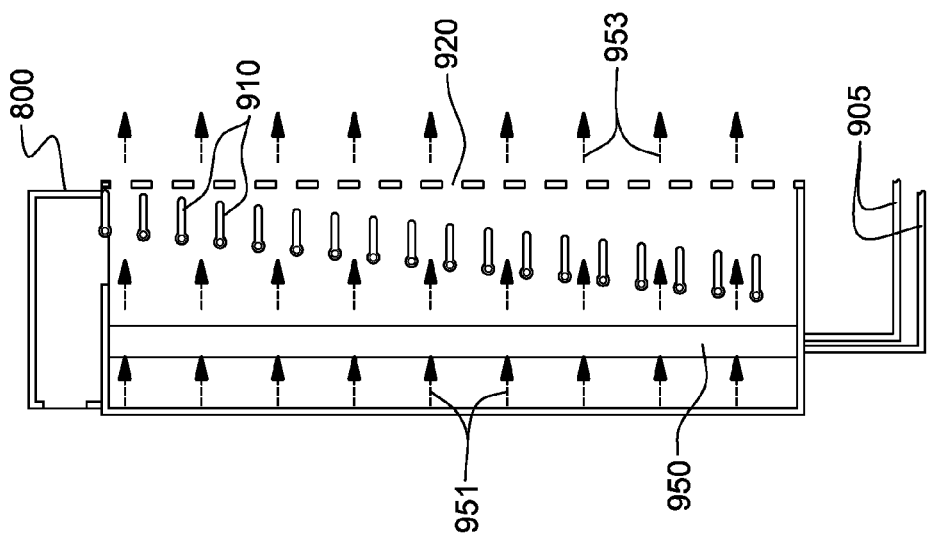
Figure 9A:
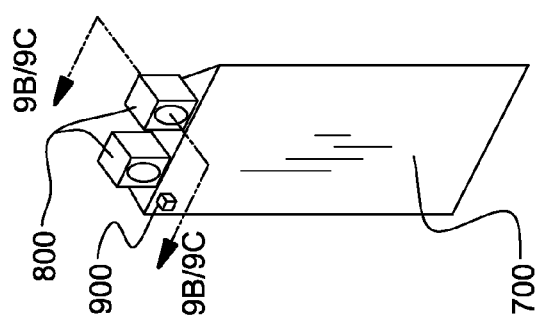

FIGS. 9A-9C provide different schematic sectional views of a rear door heat exchanger with an air recirculation mechanism, such as disclosed herein. As shown in these figures, rear door 700 is provided, with an electrical switch 900 (shown in the top left hand corner in FIG. 9A) which serves to trigger air-moving devices 800 to turn ON when rear door 700 is opened. FIGS. 9B & 9C provide a view across the sectional line 9B/9C-9B/9C of FIG. 9A, wherein FIG. 9B illustrates the rear door during normal operating mode, while FIG. 9C illustrates the rear door during maintenance mode (i.e., with the rear door open). In this respect, FIGS. 9B & 9C provide the same two scenarios depicted in the embodiment of FIGS. 8A & 8B, respectively, namely, the normal operating mode (FIG. 8A), and the maintenance mode (FIG. 8B).

Referring to FIG. 9B, rear door 700 is closed with air-moving devices 800 switched OFF. The hot exhaust air from the servers flows past the heat exchanger 950, being cooled in the process as shown by arrows 951. In one embodiment, a plurality of louvers 910 are provided as shown. After the cool air leaves the heat exchanger, it flows through one or more louver openings 920, which are present by louvers 910 being held open by the force from the flowing air 951. These louvers 910 serve to allow the air to exit the rear door from the perforated back plane into the ambient room as shown by arrows 953. In one embodiment, to provide maximum cooling, a heat exchanger 950 such as provided by IBM's Cool Blue technology is provided, but this is not a requirement for the workings of the present invention. The heat exchanger 950 uses inlet and outlet coolant, such as facility water, as shown and referenced by numerals 905.

In FIG. 9C, the rear door has been opened, triggering air-moving devices 800 to switch ON. Air suction from these devices forces louvers 910 to close and seal any path for air to enter or exit the trapezoidal plenum, through which air 957 flows. (Gravity also assists in closing louvers 910). Thus, in FIG. 9C, the hot air 951 is drawn in through heat exchanger 950 of the door and the cooled air is then drawn through a 90 degree turn into air-moving devices 800, and then expelled out at the top of the rack, over the containment plate (see FIGS. 8A & 8B). The duct at the exit of the heat exchanger can be trapezoidal, as shown in FIG. 9C, to promote uniform velocity exiting the heat exchanger.

Figure 10B:
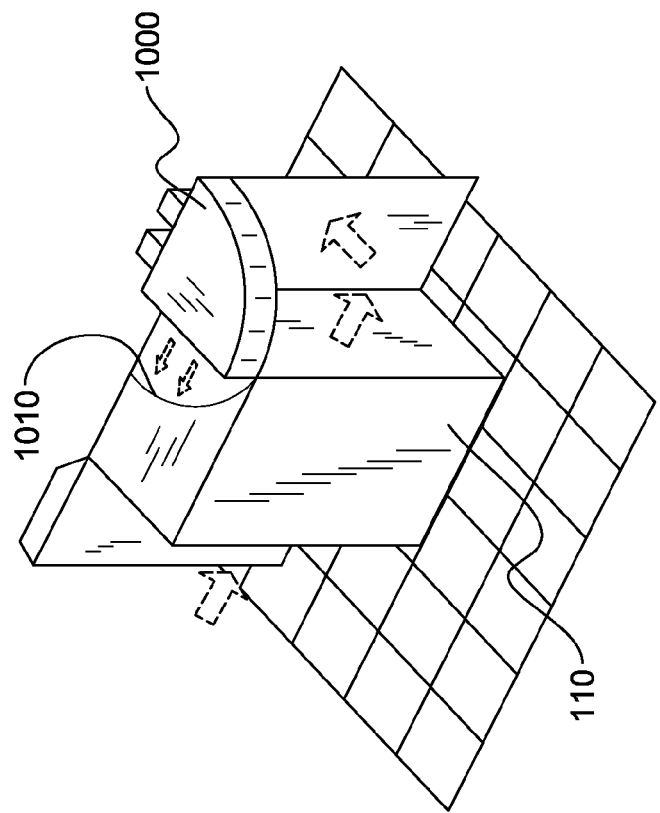
FIGS. 10A & 10B illustrate an alternate embodiment of a liquid-cooled electronics rack and air redirection mechanism mounted to the outlet door thereof, which is shown closed in FIG. 10A, and open in FIG. 10B, in accordance with an aspect of the present invention.
Figure 10A:
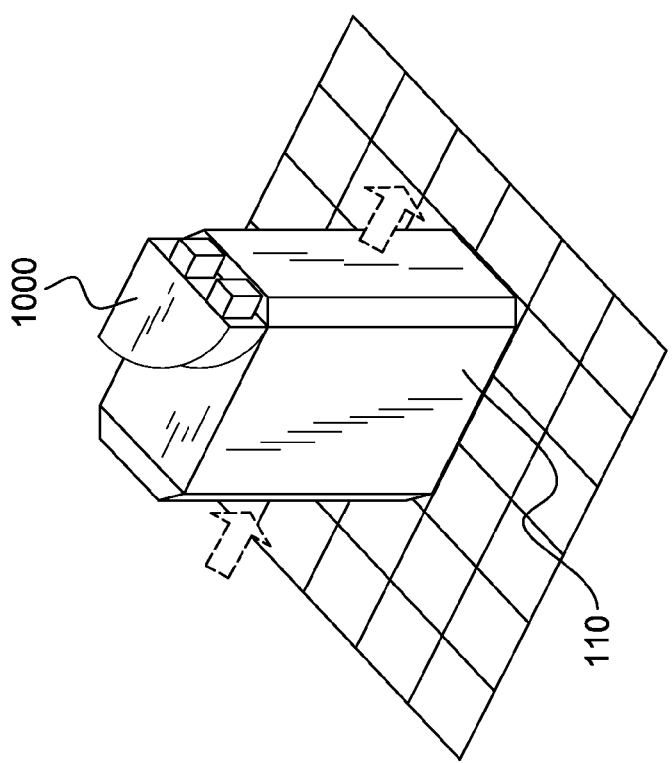

FIGS. 10A & 10B illustrate an alternate embodiment of an air redirection mechanism, in accordance with an aspect of the present invention. FIG. 10A provides an illustration of the rack during normal operating mode, while FIG. 10B provides an illustration of the rack during maintenance mode. In this embodiment, the planar containment plate of the previous embodiment is replaced with a three dimensional hinged rotating duct 1000 of the same general shape.

One advantage of using such a movable duct is that the duct ensures that the air is expelled over the top of the rack in a direction that is parallel to the length of the rack. Using such a duct also ensures greater protection from mixing between the hot and cold air streams. In one embodiment, a curved or C-shaped railing 1010 is provided as before for ensuring proper guiding of the duct when the rear door is opened or closed.

Although addressing the problem of hot air recirculation during the servicing mode, the approach depicted in FIGS. 7A-10B requires electrically powered fans to force air through the trapezoidal plenums in the rear door heat exchangers. Thus, there is a measure of energy consumed for moving the air exhausting from the air outlet side of the electronics rack into the rear door heat exchanger when the door is open. In addition, if the door is fully open with an obstruction between the door and the rear exhaust ports of the electronics rack (for example, an operator is standing between the two structures), then exhausting hot air may be redirected away from the open rear door heat exchanger, and thus not be cooled using the approach described above.

Presented below with reference to FIGS. 11A-14B, therefore, is an alternative cooling concept, which is referred to herein as the externally-mounted heat exchanger, and which includes a passive air-to-liquid heat exchanger mounted external to an electronics rack above the top of the electronics rack, with an operative position extending away from the top of the electronics rack along one of its edges. Advantageously, an IT data center is further disclosed where electronics rack clusters are provided having such externally-mounted heat exchangers extending into the natural, hot exhaust air recirculation flow paths above the electronics racks to cool air passing across the tops of the electronics racks from the air outlet to the air inlet sides.

Figure 11B:
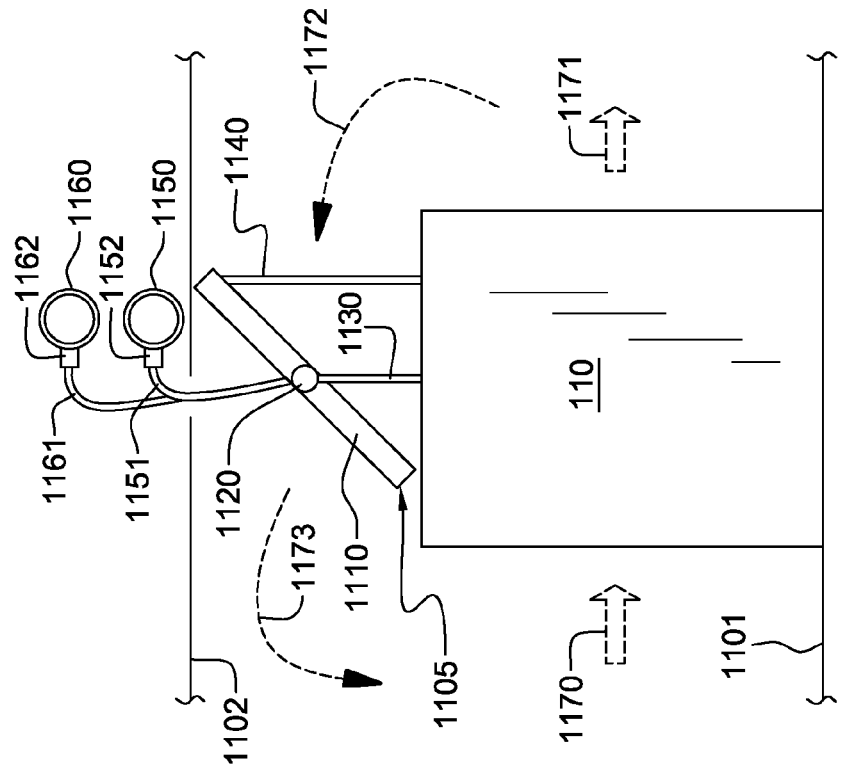
FIGS. 11A & 11B depict side elevational views of another embodiment of a data center comprising a cooled electronics system which includes an electronics rack and a heat exchange assembly, wherein the heat exchange assembly is shown in a stored position in FIG. 11A and an operative position in FIG. 11B, in accordance with an aspect of the present invention.
Figure 11A:
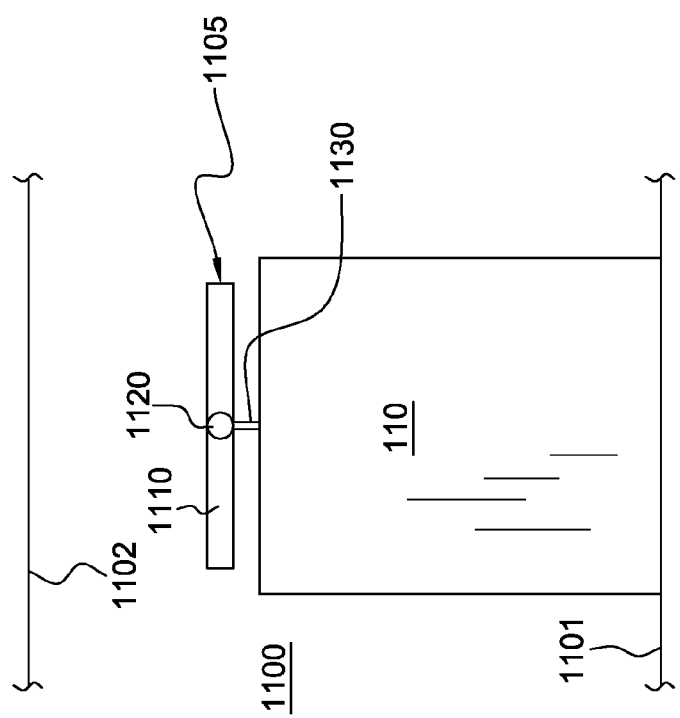

FIGS. 11A & 11B depict one embodiment of a data center 1100 having a drop ceiling 1102 and a floor 1101, on which is disposed one or more electronics racks 110, each having a heat exchange assembly 1105 coupled to an upper portion thereof. In FIG. 11A, heat exchange assembly 1105 is shown in a stored (or shipping) position, while in FIG. 11B, heat exchange assembly 1105 is shown in operative position above electronics rack 110. Heat exchange assembly 1105 includes an air-to-liquid heat exchanger 1110 pivotally mounted via at least one hinge 1120 and a telescopic hinge support structure 1130 to, for example, a top surface of electronics rack 110. In the embodiment illustrated in these figures, the one or more hinges 1120 are disposed, for example, at a center region of the air-to-liquid heat exchanger 1110. In the stored position (illustrated in FIG. 11A), the air-to-liquid heat exchanger 1110 is oriented horizontally above the rack.

As shown in FIG. 11B, in the operative position, heat exchange assembly 1105 extends away from the top surface of electronics rack 110, with telescopic hinge support structure 1130 extended, and the air-to-liquid heat exchanger 1110 angled upwards to occupy the space between the top surface of electronics rack 110 and ceiling 1102 of data center 1100. The heat exchange assembly 1105 is supported in its operative position via an auxiliary support member 1140, as illustrated. Note that in this position, the telescopic hinge support structure 1130 has raised the one or more hinges 1120 such that the hinges are approximately half way between the top surface of the electronics rack and the ceiling of the data center. The telescopic hinge support structure(s) also allow the hinge(s) to be locked in operative position via a locking feature (not shown). Using the hinge(s), the illustrated air-to-liquid heat exchanger has been rotated about its center axis (in the illustrated embodiment) such that one edge of the heat exchange assembly is close to or contacts the top surface of the electronics rack, and the other edge is close to or contacts the ceiling of the data center.

An overhead coolant supply line 1150 and coolant return line 1160 are illustrated above drop ceiling 1102 of data center 1100, disposed, for example, in an overhead space of the data center. Flexible supply and return hoses 1151, 1161, respectively, attach to the coolant supply and return lines 1150, 1160 via, for example, quick connect couplings 1152, 1162. Respective quick connect couplings allow the heat exchange assembly 1105 to be readily mated to the overhead coolant supply and return lines 1150, 1160. By way of example, these quick connect couplings may comprise various types of commercially available couplings, such as those available from Colder Products Company, of St. Paul, Minn., U.S.A., or Parker Hannifin, of Cleveland, Ohio, U.S.A. Coolant supply and return lines 1150, 1160 are designed to supply and exhaust coolant to multiple heat exchange assemblies 1105 disposed above multiple electronics racks arrayed side-by-side in the data center, as illustrated in FIG. 6. It should be noted that in FIGS. 11A & 11B, a non-raised floor arrangement is illustrated, by way of example. Further, note that the use of the telescopic hinge support structure(s) facilitates optimal positioning of the heat exchange assembly for a wide variety of data center ceiling heights and electronics rack heights.

Note that in one embodiment, the heat exchange assembly 1105 illustrated in FIGS. 11A & 11B may be used as a supplement to a liquid-cooled electronics rack comprising a rear door heat exchanger, such as described above. Alternatively, the data center may comprise air-cooled electronics racks that are auxiliary liquid-cooled using only heat exchange assemblies 1105 disposed in the space between the tops of the electronics racks and the ceiling. As illustrated in FIG. 11B, when operational, cool air 1170 is drawn in at the air inlet side of electronics rack 110 and exhausted as heated air 1171, at least a portion of which recirculates 1172 over the top of electronics rack 110 through or across heat exchange assembly 1105, exhausting as cool recirculating airflow 1173, which is then drawn back in as cool ambient air 1170 at the air inlet side of electronics rack 110. Thus, the heat exchange assembly described herein (which in one embodiment, has a width substantially equal to the width of the electronics rack above which the heat exchange assembly is positioned), results in any recirculating air from the air outlet side of the electronics rack being drawn through the heat exchange assembly for cooling by the liquid coolant flowing through the heat exchange tube sections of the heat exchanger. Each heat exchange assembly can be designed to remove the associated rack's recirculating heat load, while also providing for an acceptable air inlet temperature to the electronics rack. Further, note that the heat exchange assembly employed herein may be utilized in combination with conventional raised floor, data center air-cooling, if desired.

Figure 12A:
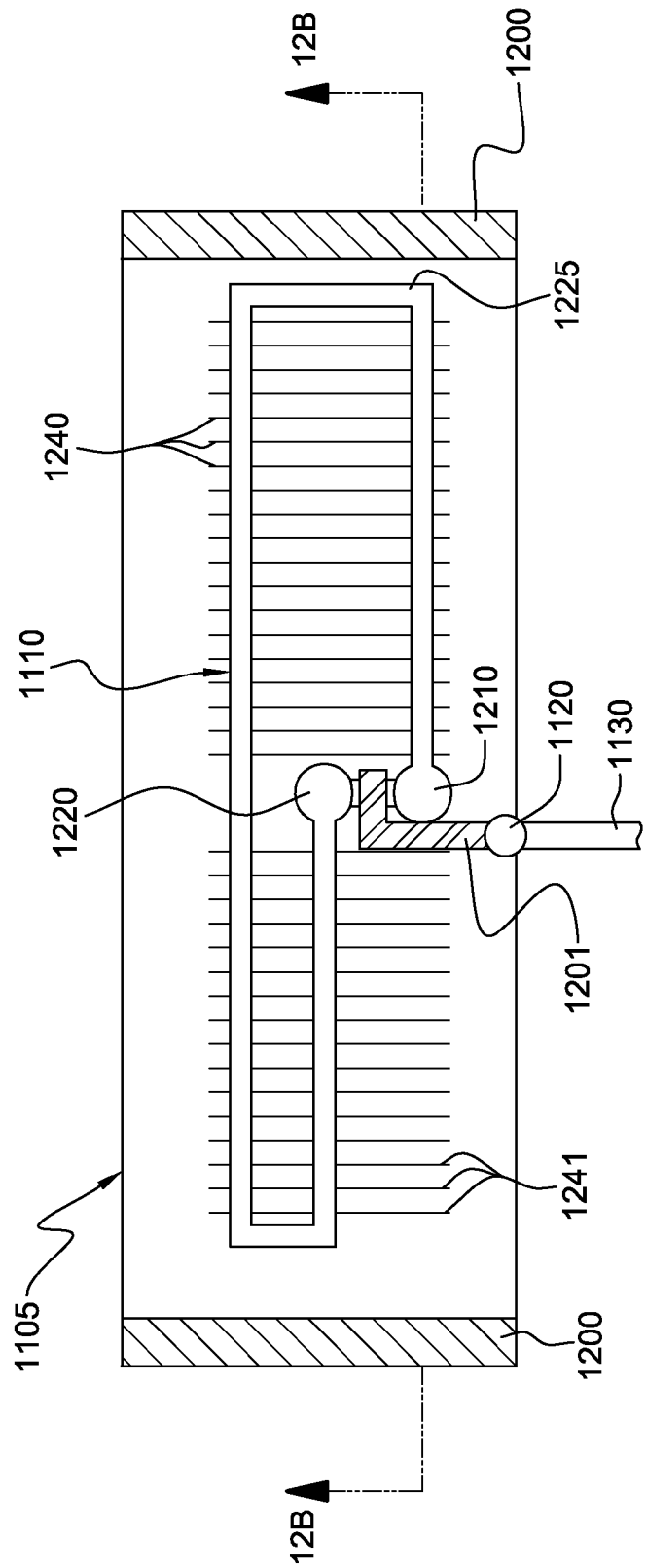
FIG. 12A is a cross-sectional elevational view of one detailed embodiment of the heat exchange assembly of FIGS. 11A & 11B, shown in stored position, and taken along line 12A-12A in FIG. 12B, in accordance with an aspect of the present invention.
Figure 12B:
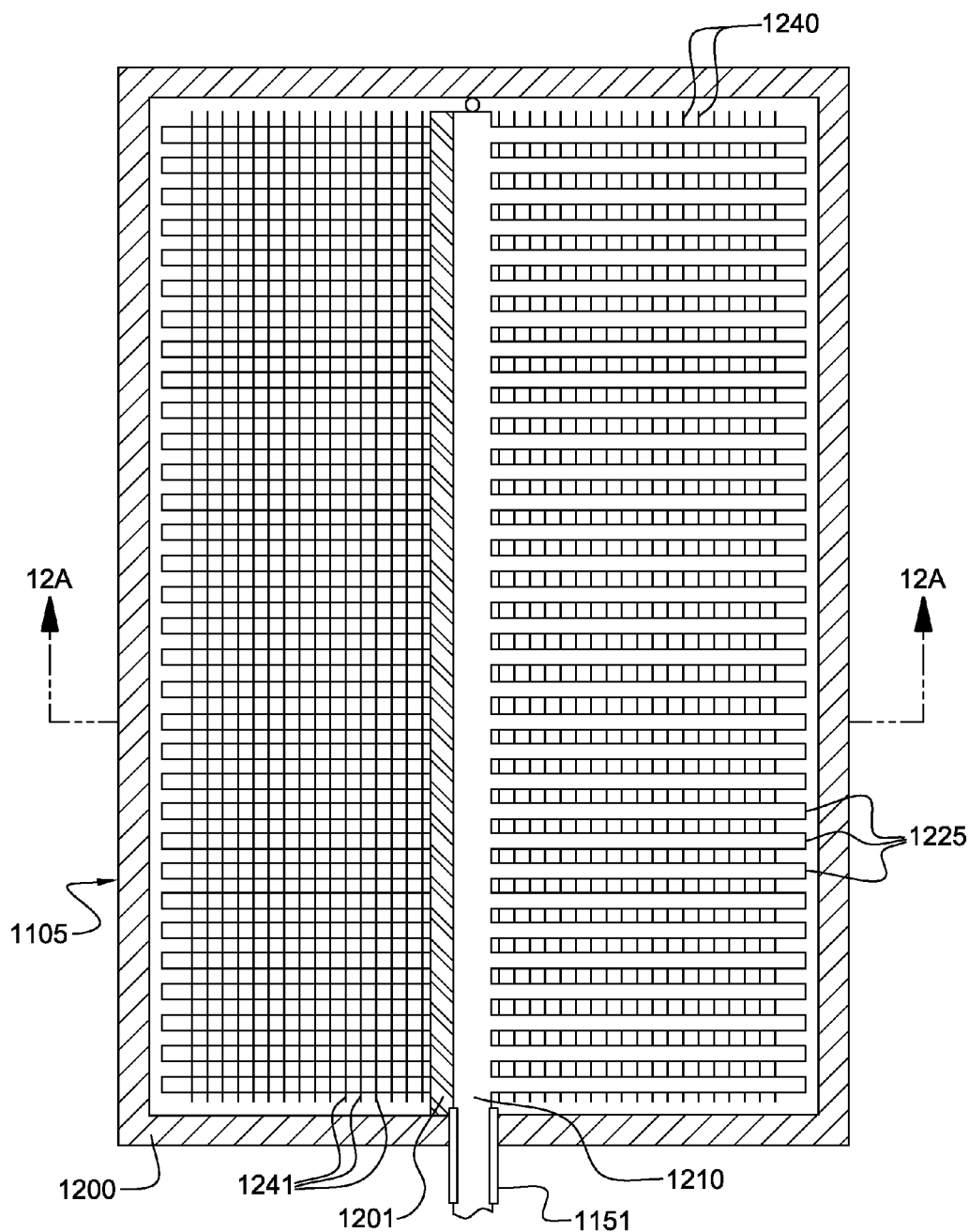
FIG. 12B is a cross-sectional plan view of the heat exchange assembly of FIG. 12A, taken along line 12B-12B thereof, in accordance with an aspect of the present invention.

FIGS. 12A & 12B depict one detailed embodiment of a heat exchange assembly 1105, in accordance with an aspect of the present invention. Referring to both figures collectively, a support frame 1200 comprises, for example, a steel structure supporting a centrally-disposed air-to-liquid heat exchanger 1110. Support structure 1200 includes an L-shaped central plate 1201, which is attached to the air-to-liquid heat exchanger 1110 between an inlet plenum 1210 and an outlet plenum 1220 thereof via (for example) brazing or soldering, as well as to at least one hinge 1120. As noted, hinge(s) 1120 is coupled to telescopic hinge support structure 1130. The coolant inlet plenum 1210 is illustrated in FIG. 12B as being coupled to coolant inlet hose 1151 for receiving cooled coolant from the overhead coolant supply line, as described above. As illustrated, air-to-liquid heat exchanger 1110 comprises a plurality of heat exchange tube sections 1225. These heat exchange tube sections 1225 each comprise a coolant channel having an inlet and an outlet, with each coolant channel inlet being coupled to the coolant inlet plenum 1210 and each coolant channel outlet being coupled to the coolant outlet plenum 1220. A plurality of fins 1240, such as rectangular-shaped, thermally conductive fins 1240, are attached to the individual heat exchange tube sections 1225 for facilitating transfer of heat from air passing across the air-to-liquid heat exchanger 1110 to coolant flowing through the plurality of heat exchange tube sections 1225. In the embodiment illustrated, overhanging fins 1241 are provided for enhanced cooling (i.e., via increased heat transfer surface area) in the region of the heat exchange tube sections looping back to the coolant outlet plenum 1220. Note that the flexible coolant supply and return hoses 1151, 1161 (see FIG. 11B) attach to the inlet and outlet, respectively, of coolant inlet plenum 1210 and coolant outlet plenum 1220 via, for example, appropriate hose barb fittings (not shown). Cool liquid coolant supplied by the coolant distribution unit within the data center flows through the heat exchange tube sections, and warm air from the exhaust of the electronics rack recirculating across the top of the electronics rack is cooled by the liquid as the air flows through the fin passages.

FIGS. 13A & 13B depict an alternate embodiment of a heat exchange assembly 1105' mounted above an electronics rack 110 disposed within a data center 1100 on a data center floor 1101. In FIG. 13A, heat exchange assembly 1105' is shown in stored position, while in FIG. 13B, heat exchange assembly 1105' is shown in operative position between a top surface 1300 of electronics rack 110 and ceiling 1102 of data center 1100. As in the prior embodiment, heat exchange assembly 1105' may be fabricated with a width approximately equal to the width of the associated electronics rack and a length sufficient so that when in operative position, air passing across the top of the rack from the air outlet side to the air inlet side of the rack necessarily flows through the heat exchange assembly.

Referencing FIG. 13A, heat exchange assembly 1105' is shown to comprise an air-to-liquid heat exchanger 1110 with a support structure to which one or more hinges 1310 couple at one end thereof. The one or more hinges each connect via a static hinge support structure 1320 to an upper portion of electronics rack 110, for example, to top surface 1300 of electronics rack 110. In this configuration, static hinge support structure 1320 is non-telescoping, relying on appropriate dimensioning of the heat exchange assembly and pivoting of the heat exchange assembly via hinges 1310 to orient the heat exchange assembly in the space between the top surface 1300 of electronics rack 110 and ceiling 1102 of data center 1100 (as illustrated in FIG. 13B). In this implementation, the lower edge of heat exchange assembly 1105' resides at (or very close to) the top surface 1300 of the electronics rack.

As noted, the operative position is illustrated in FIG. 13B, wherein an auxiliary support member 1340 facilitates maintaining the heat exchange assembly 1105' at an angle (relative to top surface 1300 of electronics rack 110), required to substantially fill the space between the top of the electronics rack and the data center ceiling. As in the prior embodiment, flexible supply and return hoses 1151, 1161 couple via quick connect couplings 1152, 1162 to the respective coolant supply line 1150 and coolant return line 1160 disposed in the overhead space above data center ceiling 1102. Air circulation arrows are also illustrated in FIG. 13B, similar to those described above in connection with FIG. 11B. Note that, for a given top of rack to ceiling distance, the heat exchange assembly can be tailored to form any desired angle to the top of the rack when in the operative position, such as illustrated in FIG. 13B. In one specific example, the heat exchange assembly could be tailored to form a 90 degree angle relative to the top of the electronics rack, if desired.

FIGS. 14A & 14B depict an alternate embodiment of a cooled electronics system, in accordance with an aspect of the present invention. As illustrated, one or more electronics rack 110 are disposed on a floor 1101 of a data center 1100 having a ceiling 1102. Each electronics rack has associated therewith a heat exchange assembly 1405 which, in this embodiment, is mounted to an overhead support structure 1400 associated with ceiling 1102. Heat exchange assembly 1405 includes an air-to-liquid heat exchanger 1410 mounted within a support structure, such as described above in connection with FIGS. 12A & 12B. One or more hinges 1420 are provided at one end of heat exchange assembly 1405, which are mounted via, for example, one or more static hinge support structures 1430 to overhead support structure 1400. FIG. 14A depicts the heat exchange assembly in stored position, wherein the air-to-liquid heat exchanger 1410 resides horizontal to the top surface 1300 of electronics rack 1110, while FIG. 14B depicts the heat exchange assembly 1405 in operative position with the distal end of the air-to-liquid heat exchanger 1410 contacting (or in close proximity to) top surface 1300 of electronics rack 110. In this example, in addition to static hinge support structure(s) 1430, one or more telescoping auxiliary support members 1440 are provided to facilitate maintaining heat exchange assembly 1405 in operative position above electronics rack 110 between the electronics rack top surface and the data center ceiling. As with the prior embodiments, a coolant supply line 1450 and coolant return line 1460 are provided in an overhead space above ceiling 1102, and the coolant inlet plenum and coolant outlet plenum of air-to-liquid heat exchanger 1410 are in fluid communication with the supply and return lines via respective, flexible hoses 1451, 1461, which are coupled (in one embodiment) via quick connect couplings 1452, 1462 to the supply and return lines, respectively. Airflow through the electronics rack and above the top surface of the electronics rack is illustrated in FIG. 14B, and is as described above in connection with FIG. 11B. Note that the embodiment illustrated in FIGS. 14A & 14B might be advantageous in view of the smaller flexible hose 1451, 1461, lengths required. In addition, the flexible hoses in this embodiment would not be routed visibly to the top surface of the electronics rack.

Note also that in the embodiments of FIGS. 14A & 14B, the heat exchange assembly is again sized with a width substantially equal to a width of the associated electronics rack 110 depicted. Further, the externally-mounted heat exchange assembly is disposed above the electronics rack and is designed to transition between the stored position and the operative position, as illustrated.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus for facilitating cooling of an electronics rack residing within a data center, the apparatus comprising:
a heat exchange assembly configured to mount external to the electronics rack, wherein the electronics rack comprising an air inlet side and an air outlet side and external air outside the electronics rack moves through the electronics rack by entering an air inlet at the air inlet side and exiting an air outlet at the air outlet side, and wherein the heat exchange assembly is configured to mount above the electronics rack in an operative position, and to cool recirculating hot air, the recirculating hot air comprising hot air rejected from the air outlet side of the electronics rack to the external air, and recirculating above the electronics rack from the air outlet side to the air inlet side, the heat exchange assembly being mounted and sized to facilitate passing the recirculating hot air through the heat exchange assembly, and wherein the heat exchange assembly comprises:
a support structure to support hinged mounting of the heat exchange assembly directly above and external to the electronics rack; and
an air-to-liquid heat exchanger coupled to the support structure, at least one hinge coupled to the support structure to hingedly attach the air-to-liquid heat exchanger to at least one of an upper portion of the electronics rack or an overhead support structure of the data center in a position aligned over the electronics rack, the air-to-liquid heat exchanger having an inlet plenum and an outlet plenum in fluid communication with respective connect couplings of the heat exchange assembly, the respective connect couplings facilitating connection of the inlet and outlet plenums to a coolant supply line and a coolant return line, respectively, and wherein the air-to-liquid heat exchanger further comprises at least one heat exchange tube section, each heat exchange tube section comprising a coolant channel having a coolant channel inlet and a coolant channel outlet, each coolant channel inlet being coupled to the inlet plenum and each coolant channel outlet being coupled to the outlet plenum.

2. The apparatus of claim 1, wherein the heat exchange assembly further comprises the at least one hinge coupled to the support structure to hingedly attach the air-to-liquid heat exchanger to the upper portion of the electronics rack, wherein the at least one hinge facilitates pivotal movement of the air-to-liquid heat exchanger between a stored position and the operative position above the electronics rack, and wherein in the stored position the air-to-liquid heat exchanger resides substantially horizontal above the electronics rack and in the operative position the air-to-liquid heat exchanger projects above and away from the electronics rack at an angle to a top surface of the electronics rack.

3. The apparatus of claim 2, wherein the support structure comprises a central plate extending centrally through the air-to-liquid heat exchanger, and wherein the inlet plenum and the outlet plenum of the air-to-liquid heat exchanger couple to and are supported by the central plate, and the at least one hinge couples to the central plate at a central region of the air-to-liquid heat exchanger.

4. The apparatus of claim 3, wherein the heat exchange assembly further comprises at least one telescopic hinge support structure coupled to the upper portion of the electronics rack and to the at least one hinge for facilitating telescopic positioning of the air-to-liquid heat exchanger above the electronics rack in the operative position, and thus facilitate the recirculating hot air passing above the electronics rack from the air outlet side to the air inlet side passing through the heat exchange assembly.

5. The apparatus of claim 4, wherein the heat exchange assembly further comprises at least one auxiliary support member for facilitating support of the air-to-liquid heat exchanger in the operative position above and external to the electronics rack.

6. The apparatus of claim 2, wherein the heat exchange assembly further comprises at least one static hinge support structure connecting the at least one hinge to the top portion of the electronics rack, and wherein the heat exchange assembly further comprises at least one auxiliary support member for facilitating support of the air-to-liquid heat exchanger in the operative position above and external to the electronics rack.

7. The apparatus of claim 1, wherein the heat exchange assembly has a width substantially equal to a width of the electronics rack to facilitate the recirculating hot air passing above the electronics rack from the air outlet side to the air inlet side passing through the heat exchange assembly for cooling of the recirculating hot air prior to returning to the air inlet side of the electronics rack.

8. The apparatus of claim 1, wherein the heat exchange assembly further comprises the at least one hinge coupled to the support structure for hingedly attaching the air-to-liquid heat exchanger to the overhead support structure of the data center containing the electronics rack in the position aligned over the electronics rack, wherein the at least one hinge facilitates movement of the air-to-liquid heat exchanger between a stored position and the operative position above and external to the electronics rack, and wherein in the stored position the air-to-liquid heat exchanger resides substantially horizontal above the electronics rack and in the operative position the air-to-liquid heat exchanger projects downwards towards the electronics rack at an angle to a top surface of the electronics rack.

9. The apparatus of claim 8, further comprising at least one hinge support structure connecting the at least one hinge to the overhead support structure of the data center, and wherein the heat exchange assembly further comprises at least one auxiliary support member for facilitating support of the air-to-liquid heat exchanger in the operative position above and external to the electronics rack, and wherein the at least one hinge support structure comprises at least one of a static hinge support structure or a telescopic hinge support structure for facilitating positioning of the air-to-liquid heat exchanger in the operative position above and external to the electronics rack.

10. A cooled electronics system comprising:
an electronics rack, the electronics rack resides within a data center, the data center comprising an overhead support structure, the electronics rack comprising:
an air inlet side comprising an air inlet and an air outlet side comprising an air outlet, the air inlet and the air outlet respectively enabling ingress and egress of external air outside the electronics rack through the electronics rack;
at least one electronics subsystem disposed within the electronics rack;
at least one air-moving device, the at least one air-moving device causing the external air to flow through the electronics rack from the air inlet side of the electronics rack, across the at least one electronics subsystem to the air outlet side of the electronics rack and be rejected as hot air from the air outlet of the electronics rack to the external air; and
a heat exchange assembly mounted directly above and external to the electronics rack, wherein the heat exchange assembly is configured and positioned in an operative position to cool recirculating hot air above the electronics rack from the air outlet side to the air inlet side passes through the heat exchange assembly, and wherein the heat exchange assembly comprises:
a support structure supporting hinged mounting of the heat exchange assembly above and external to the electronics rack; and
an air-to-liquid heat exchanger coupled to the support structure, at least one hinge coupled to the support structure to hingedly attach the air-to-liquid heat exchanger to at least one of an upper portion of the electronics rack or the overhead support structure of the data center, the air-to-liquid heat exchanger having an inlet plenum and an outlet plenum in fluid communication with respective connect couplings of the heat exchange assembly, the respective connect couplings facilitating connection of the inlet and outlet plenums to a coolant supply line and a coolant return line, respectively, and wherein the air-to-liquid heat exchanger further comprises at least one heat exchange tube section, each heat exchange tube section comprising a coolant channel having a coolant channel inlet and a coolant channel outlet, each coolant channel inlet being coupled to the inlet plenum and each coolant channel outlet being coupled to the outlet plenum.

11. The cooled electronics system of claim 10, wherein the heat exchange assembly further comprises the at least one hinge coupled to the support structure and hingedly attaching the air-to-liquid heat exchanger to the upper portion of the electronics rack, wherein the at least one hinge facilitates pivotal movement of the air-to-liquid heat exchanger between a stored position and the operative position above the electronics rack, and wherein in the stored position the air-to-liquid heat exchanger resides substantially horizontal above the electronics rack and in the operative position the air-to-liquid heat exchanger projects above and away from the electronics rack at an angle to a top surface of the electronics rack.

12. The cooled electronics system of claim 11, wherein the support structure comprises a central plate extending centrally through the air-to-liquid heat exchanger, and the inlet plenum and the outlet plenum of the air-to-liquid heat exchanger couple to and are supported by the central plate, and the at least one hinge couples to the central plate at a central region of the air-to-liquid heat exchanger.

13. The cooled electronics system of claim 12, wherein the heat exchange assembly further comprises at least one telescopic hinge support structure coupled to the upper portion of the electronics rack and to the at least one hinge for facilitating telescopic positioning of the air-to-liquid heat exchanger above the electronics rack in the operative position, and thus facilitate the recirculating hot air passing above the electronics rack from the air outlet side to the air inlet side passing through the heat exchange assembly.

14. The cooled electronics system of claim 13, wherein the heat exchange assembly further comprises at least one auxiliary support member attached to the upper portion of the electronics rack for facilitating support of the air-to-liquid heat exchanger in the operative position above and external to the electronics rack.

15. The cooled electronics system of claim 11, wherein the heat exchange assembly further comprises at least one static hinge support structure connecting the at least one hinge to the top portion of the electronics rack, and wherein the heat exchange assembly further comprises at least one auxiliary support member for facilitating support of the air-to-liquid heat exchanger in the operative position above and external to the electronics rack.

16. The cooled electronics system of claim 10, wherein the heat exchange assembly has a width substantially equal to a width of the electronics rack to facilitate the recirculating hot air passing above the electronics rack from the air outlet side to the air inlet side passing through the heat exchange assembly for cooling of the recirculating hot air prior to returning to the air inlet side of the electronics rack.

17. The cooled electronics system of claim 10, wherein the heat exchange assembly further comprises the at least one hinge coupled to the support structure and hingedly attaching the air-to-liquid heat exchanger to the overhead support structure of the data center, wherein the at least one hinge facilitates movement of the air-to-liquid heat exchanger between a stored position and the operative position above and external to the electronics rack, and wherein in the stored position the air-to-liquid heat exchanger resides substantially horizontal above the electronics rack and in the operative position the air-to-liquid heat exchanger projects downwards towards the electronics rack at an angle to a top surface of the electronics rack.

18. The cooled electronics system of claim of claim 17, further comprising at least one hinge support structure connecting the at least one hinge to the overhead support structure of the data center, and wherein the heat exchange assembly further comprises at least one auxiliary support member for facilitating supporting of the air-to-liquid heat exchanger in the operative position above and external to the electronics rack, and wherein the at least one hinge support structure comprises at least one of a static hinge support structure or a telescopic hinge support structure for facilitating positioning of the air-to-liquid heat exchanger in the operative position above and external to the electronics rack.

19. A method of facilitating cooling of an electronics rack, the electronics rack resides within a data center, the method comprising:

providing a heat exchange assembly configured to mount external to an electronics rack, wherein the electronics rack comprising an air inlet side and an air outlet side and external air outside the electronics rack moves through the electronics rack by entering an air inlet at the air inlet side and exiting an air outlet at the air outlet side, and wherein the heat exchange assembly is configured to mount above the electronics rack in an operative position, and to cool recirculating hot air, the recirculating hot air comprising hot air rejected from the air outlet side of the electronics rack to the external air, and recirculating above the electronics rack from the air outlet side to the air inlet side, the heat exchange assembly being mounted and sized to facilitate passing the recirculating hot air through the heat exchange assembly; and wherein the heat exchange assembly comprises a support structure to support hinged mounting of the heat exchange assembly directly above and external to the electronics rack, at least one hinge coupled to the support structure to hingedly attach the heat exchanger assembly to at least one of an upper portion of the electronics rack or an overhead support structure of the data center, and an air-to-liquid heat exchanger coupled to the support structure, the air-to-liquid heat exchanger having an inlet plenum and an outlet plenum in fluid communication with respective connect couplings of the heat exchange assembly, the respective connect couplings facilitating connection of the inlet and outlet plenums to a coolant supply line and a coolant return line, respectively, and wherein the air-to-liquid heat exchanger further comprises at least one heat exchange tube section, each heat exchange tube section comprising a coolant channel having a coolant channel inlet and a coolant channel outlet, each coolant channel inlet being coupled to the inlet plenum and each coolant channel outlet being coupled to the outlet plenum.

20. The method of claim 19, wherein the at least one hinge facilitating pivotal movement of the air-to-liquid heat exchanger between a stored position and the operative position above the electronics rack, and wherein in the stored position the air-to-liquid heat exchanger resides substantially horizontal above the electronics rack and in the operative position the air-to-liquid heat exchange projects above and away from the electronics rack at an angle to a top surface of the electronics rack.

* * * * *